(12) United States Patent
Koestenbauer et al.

(10) Patent No.: US 11,047,038 B2
(45) Date of Patent: Jun. 29, 2021

(54) METALLIZATION FOR A THIN-FILM COMPONENT, PROCESS FOR THE PRODUCTION THEREOF AND SPUTTERING TARGET

(71) Applicant: PLANSEE SE, Reutte (AT)

(72) Inventors: Harald Koestenbauer, Breitenwang (AT); Judith Koestenbauer, Breitenwang (AT); Gerhard Leichtfried, Reutte (AT); Joerg Winkler, Reutte (AT); Moo Sung Hwang, Sungnam (KR); Martin Kathrein, Reutte (AT); Elisabeth Eidenberger, Breitenwang (AT)

(73) Assignee: Plansee SE, Reutte (AT)

( * ) Notice: Subject to any disclaimer, the term of this patent is extended or adjusted under 35 U.S.C. 154(b) by 374 days.

(21) Appl. No.: 15/504,997

(22) PCT Filed: Aug. 10, 2015

(86) PCT No.: PCT/AT2015/000106
§ 371 (c)(1),
(2) Date: Feb. 17, 2017

(87) PCT Pub. No.: WO2016/025968
PCT Pub. Date: Feb. 25, 2016

(65) Prior Publication Data
US 2017/0260622 A1    Sep. 14, 2017

(30) Foreign Application Priority Data

Aug. 20, 2014  (AT) ..................................... 302/2014

(51) Int. Cl.
*B32B 15/00*    (2006.01)
*C23C 14/34*    (2006.01)
(Continued)

(52) U.S. Cl.
CPC .......... *C23C 14/3414* (2013.01); *C22C 1/045* (2013.01); *C22C 27/04* (2013.01);
(Continued)

(58) Field of Classification Search
None
See application file for complete search history.

(56) References Cited

U.S. PATENT DOCUMENTS 3,725,054 A * 4/1973 Perfect ...................... C22C 1/03
420/580
5,595,616 A    1/1997 Berczik
(Continued)

FOREIGN PATENT DOCUMENTS

CN    101244644 A    8/2008
CN    102047433 A    5/2011
(Continued)

OTHER PUBLICATIONS

Inaguma et al., machine translation of JP 2010-132974 Description, Jun. 17, 2010 (Year: 2010).*

(Continued)

*Primary Examiner* — Humera N. Sheikh
*Assistant Examiner* — Mary I Omori
(74) *Attorney, Agent, or Firm* — Laurence A. Greenberg; Werner H. Stemer; Ralph E. Locher

(57) ABSTRACT

A metallization for a thin-film component includes at least one layer composed of an Mo-based alloy containing Al and Ti and usual impurities. A process for producing a metallization includes providing at least one sputtering target, depositing at least one layer of an Mo-based alloy containing Al and Ti and usual impurities, and structuring the metallization by using at least one photolithographic process and at least one subsequent etching step. A sputtering target is composed of an Mo-based alloy containing Al and Ti and
(Continued)

usual impurities. A process for producing a sputtering target composed of an Mo-based alloy includes providing a powder mixture containing Mo and also Al and Ti and cold gas spraying (CGS) of the powder mixture onto a suitable support material.

4 Claims, 5 Drawing Sheets

(51) Int. Cl.
  *C22C 27/04* (2006.01)
  *C23C 24/04* (2006.01)
  *C22C 1/04* (2006.01)
  *H01B 1/02* (2006.01)
  *H01L 23/532* (2006.01)

(52) U.S. Cl.
  CPC ............ *C23C 24/04* (2013.01); *H01B 1/023* (2013.01); *H01L 23/53223* (2013.01); *H01L 23/53238* (2013.01); *H01L 23/53252* (2013.01)

(56) References Cited

U.S. PATENT DOCUMENTS

| | | | |
|---|---|---|---|
| 6,933,525 | B2 | 8/2005 | Harano et al. |
| 8,507,916 | B2 | 8/2013 | Misaki |
| 2004/0135143 | A1 | 7/2004 | Harano et al. |
| 2005/0074561 | A1 | 4/2005 | Tabaru et al. |
| 2005/0242454 | A1* | 11/2005 | Yuasa .................. B29C 33/424 264/2.5 |
| 2006/0091397 | A1 | 5/2006 | Akimoto et al. |
| 2009/0260678 | A1 | 10/2009 | Di Stefano |
| 2011/0098209 | A1 | 4/2011 | Smets et al. |
| 2011/0117375 | A1* | 5/2011 | Rozak .................. C23C 14/548 428/457 |
| 2012/0301732 | A1 | 11/2012 | Okuno et al. |
| 2013/0222726 | A1 | 8/2013 | Choi et al. |
| 2013/0233706 | A1 | 9/2013 | Matsumoto et al. |
| 2015/0049788 | A1* | 2/2015 | Fujita .................. C30B 29/605 374/185 |

FOREIGN PATENT DOCUMENTS

| | | |
|---|---|---|
| CN | 102870221 A | 1/2013 |
| CN | 103293804 A | 9/2013 |
| CN | 103459631 A | 12/2013 |
| EP | 0260600 A2 | 3/1988 |
| EP | 2690185 A1 | 1/2014 |
| JP | H10512329 A | 11/1998 |
| JP | 2000063971 A | 2/2000 |
| JP | 2000064033 A | 2/2000 |
| JP | 2004214581 A | 7/2004 |
| JP | 2004250788 A | 9/2004 |
| JP | 2005097697 A | 4/2005 |
| JP | 2005154814 A | 6/2005 |
| JP | 2006156369 A | 6/2006 |
| JP | 2008255440 A | 10/2008 |
| JP | 2009231744 A | 10/2009 |
| JP | 2010132974 A | 6/2010 |
| JP | 2011232654 A | 11/2011 |
| JP | 2013060655 A | 4/2013 |
| JP | 2013060656 A | 4/2013 |
| JP | 2013147734 A | 8/2013 |
| TW | I431140 B | 3/2014 |
| TW | I437114 B | 5/2014 |
| TW | I447250 B | 8/2014 |
| WO | 2008137689 A2 | 11/2008 |
| WO | 2013024845 A1 | 2/2013 |
| WO | 2014073633 A1 | 5/2014 |

OTHER PUBLICATIONS

Murata, Hideo, machine translation of JP 2013-060655 Description, Apr. 4, 2013 (Year: 2013).*

Jorg, Tanja, Oxidation and wet etching behavior of sputtered ternary molybdenum alloy thin films, Mar. 2014 (Year: 2014).*

V. Raghavan. Al—Mo—Ti (Aluminum-Molybdenum-Titanium), 2011, Journal of Phase Equilibria and Diffusion (Year: 2011).*

Jörg et al: "Oxidation and wet etching behavior of sputtered Mo—Ti—Al films", Journal of Vacuum Science & Technology A:Vacuum, Surfaces, and Films 36(2), Mar./Apr. 2018, https://doi.org/10.1116/1.5009289.

H. Koestenbauer; New Oxidation Resistant Ternary Molybdenum Alloys; Apr. 15, 2015; Plansee SE; Austria.

Lorenz et al.: "Sputtered MoAlTi thin films with improved oxidation behavior for display applications", 61st Annual Technical Conference Proceedings Orlando, Florida, USA, May 7-10, 2018, https://doi.org/10.14332/svc18.proc0050.

Lorenz et al.: "Oxidation and wet-etching behaviour of MoAlTi thin films deposited by sputtering from a rotatable MoAlTi compound target", Journal of Vacuum Science & Technology B 37, 021202 (2019); doi: 10.1116/1.5079866.

Rausch et al.: "Sputter deposition of Mo-based multicomponent thin films from rotatable targets: Experiment and simulation", applied Surface Science 455 (2018) 1029-1036.

Kim et al.: "High Mobility Al-doped In—Sn—Zn—O Thin-Film-Transistors with Molybdenum Alloy Copper Barrier Source/Drain Electrode", Dept. of Materials Science and Engineering, KAIST, Daejeon 305-701, Rebublic of Korea, IMID 2018 Digest.

Rodrigues, et al. "A Study of Al/Mo Powder Processing as a Possible Way to Corrosion Resistent Aluminum-Alloys", Material Research, vol. 12, No. 2, pp. 211-218, 2009.

N. Saunders, "The Al—Mo System (Aluminium-Molybdenum)", Section II: Phase Diagram, Journal of Phase Equilibria vol. 18, No. 4, 1997, pp. 370-378.

* cited by examiner

METALLIZATION FOR A THIN-FILM COMPONENT, PROCESS FOR THE PRODUCTION THEREOF AND SPUTTERING TARGET

BACKGROUND OF THE INVENTION

Field of the Invention

The invention relates to a metallization for a thin-film component and also a process for producing a metallization. The invention further relates to a sputtering target composed of an Mo-based alloy and also a process for producing a sputtering target composed of an Mo-based alloy.

Metallizations for thin-film components can be produced by sputtering of appropriate sputtering targets. Sputtering, also referred to as cathode atomization, is a physical process in which atoms are detached from a sputtering target by bombardment with high-energy ions and go over into the gas phase.

Metallizations for thin-film components can be, for example, conductor tracks and electrodes (e.g. source, drain and gate electrodes in a TFT (thin-film transistor)) and are used in many electronic appliances, for example in LCDs (liquid crystal displays) or OLED (organic light-emitting diode) displays, in PC (personal computer) systems or in mobile appliances such as mobile telephones, smartphones, tablet PCs, PDAs (personal digital assistants), portable music players, solar cells, etc.

The basic structure of such a metallization consists of at least one electrically conductive layer which functions, for example, as conductor track or electrode. In addition, multilayer embodiments of such metallizations are known. Such an electrically conductive layer can, for example, contain or consist of a metal having good electrical conductivity, e.g. Al, Cu, Ag or Au. Particularly for improving the adhesion on a substrate, a metallic intermediate layer composed of Mo, W, Ti, Nb or Ta or an alloy based on one of these metals can be provided between the at least one electrically conductive layer and the substrate. This intermediate layer can in some applications also meet the requirements for a diffusion barrier when it is in direct contact with a semiconductor material, for example Si (a-Si/amorphous Si or LTPS/low temperature polysilicon layer). Furthermore, a covering layer composed of Mo, W, Ti, Nb or Ta or an alloy based on one of these metals, which serves as protective layer (for example against mechanical damage, corrosion, oxidation, moisture) and/or diffusion barrier for an adjoining electrically conductive layer or a transparent conductive layer (TCO, e.g. indium-tin oxide), can additionally be provided.

Such metallizations, both the electrically conductive layers, usually metallic layers composed of Al, Cu, Ag or Au or an alloy based on one of these metals, and also any intermediate or covering layers provided, are usually produced by means of a vapour deposition process (e.g. sputtering), with the subsequent structuring of the individual layers being carried out by means of photolithography in combination with a wet-chemical or dry etching process. To produce a multilayer metallization, it is advantageous for the individual layers of the metallization to have a comparable etching rate or be able to be etched in the same etching medium. In this case, the etching process can be carried out in one step, the etching medium does not have to be adapted for the structuring of the individual layers of the metallization and, as a consequence, the manufacturing costs can be reduced.

Apart from a sufficient electrical conductivity and an advantageous etching behaviour as described, such a metallization should have further properties. During the production process of a thin-film component containing such a metallization, elevated temperatures can occur in oxygen-containing atmospheres, for example in the production of LTPS or when an intermediate heat treatment in air is necessary. This can lead to oxidation of the metallization and thus to discoloration of the metallic surface, which in turn can lead to a reduction in the electrical conductivity or in the case of (automatic) optical quality control to an increased reject rate. Mobile appliances, in particular, are also exposed to an increased level of different environmental influences (moisture, etc.) during operation and damage to the metallization by corrosion or other reactions can occur. Once again, the electrical conductivity can be reduced and the function of the thin-film component can be impaired.

In summary, a metallization for a thin-film component thus has to meet a variety of electrical, chemical and optical requirements. The metallization has to have a sufficiently high electrical conductivity (a sufficiently low electrical resistance) and also a very low transition resistance to the materials to be contacted (e.g. semiconductor materials, transparent conductive oxides (TCOs)). The metallization should have a high oxidation resistance in order to prevent damage during the manufacturing process. Furthermore, the metallization should have a high corrosion resistance and resistance to external influences, while excellent etching behaviour (good etchability) of the metallization is desirable at the same time. In addition, the etching rates of individual layers in the case of multilayer metallizations should be comparable/similar in the interests of inexpensive production. In addition, the metallization should be able to serve as diffusion barrier against diffusion of silicon.

Such metallizations are produced using, for example, sputtering targets composed of appropriate metals or alloys which are ablated by means of sputtering, for example magnetron sputtering. As a result, the atoms of the sputtering target which have gone over into the gas phase are deposited again on the substrate to be coated and a corresponding layer is formed.

Sputtering targets composed of Al alloys which can be used for producing diffusion barriers in displays (diffusion between Si and Al) are described, for example, in JP 2011 232654 A. The corresponding use in an Al alloy layer containing a monolayer of an Al—Mo alloy containing 30 at % of Mo or an Al—Mo—X alloy containing Mo and at least one of the elements X, where X=(Mn, Nd, Ni, Mg and Fe) is also known. However, excessively high Al contents in such alloy layers can lead to the layers no longer being suitable as diffusion barriers since Al is not suitable as diffusion barrier against Si. In addition, undesirable reactions between Al and Mo can occur.

Sputtering targets composed of Al-rare earth alloys are likewise known, for example from US 2012 0301732 A1. These are sputtering targets having the composition Al—X-rare earth metal, optionally with further additions of Ni, Co, Cu, Ge. Here, X is at least one element from the group (Ta, Nb, Re, Zr, W, Mo, V, Hf, Ti, Cr and Pt) and is present in an amount in the range from 0.1 to 5 at %. The respective rare earth metal is present in an amount of from 0.1 to 4 at %. However, targets containing rare earth metals are not very advantageous because of the high costs and limited availability. Furthermore, suitability of layers deposited by means of such targets as diffusion barrier is limited because of the low content of elements of the group X. They are unsuitable against diffusion of Si (in contact with semiconductor materials).

To ensure good sputtering properties (e.g. uniform sputtering rate, layer homogeneity, uniform layer thickness), sputtering targets have to have a high relative density. Low relative densities reduce the coating rate and can lead to increased particle formation during sputtering, which in turn can have an adverse effect on the properties of the sputtered layer (e.g. poor layer homogeneity) and the coating process (e.g. high incidence of arcing, short circuits).

Mo—Al and W—Al alloy sputtering targets which have high relative densities of greater than or equal to 98% or 99% are described in JP 2000 064033 A and JP 2000 063971 A. However, these sputtering targets contain only from 3 to 10% by weight of Mo or W and have at least one type of intermetallic phase (e.g. $MoAl_{12}$, $MoAl_5$, $MoAl_4$, $Mo_3Al_8$, $MoAl$ and $Mo_3Al$ or $WAl_{12}$, $WAl_5$ and $WAl_4$) in the microstructure.

However, such intermetallic phases which may be present in the microstructure of such sputtering targets can likewise lead to increased particle formation during sputtering and have an adverse effect on the properties of the sputtered layer. The term intermetallic phases refers to phases which occur in binary, ternary or multicomponent systems and whose existence range does not continue to the pure components. They frequently have crystal structures which differ from the crystal structures of the pure components and also proportions of nonmetallic bonding types. Intermetallic phases are characterized in particular by a composition of different valency and a finite homogeneity range, i.e. a narrow stoichiometric composition. Intermetallic phases are frequently brittle, i.e. have a low toughness which can subsequently have an adverse effect on the sputtering target. There are a large number of possible intermetallic phases in the binary system Al—Mo, as can clearly be seen from the phase diagram (FIG. 1).

The production of sputtering targets which are suitable for the deposition of metallizations for thin-film components can be carried out either by a conventional metallurgical route or a powder metallurgical route.

An example of the production of Mo—W sputtering targets via the powder metallurgical route is described, for example, in JP 2005 097697 A. It is stated here that the addition of small amounts of Al can improve the sinterability of Mo—W sputtering targets. The sputtering targets described have W contents of from 0.1 to 70% by weight and Al contents of from 0.1 to 50% by weight, balance Mo, and are produced by mixing of Al, W and Mo powders, pressing and sintering at from 1300 to 1600° C. The microstructure of the sputtering targets produced in this way has regions of Al phase between particles of Mo—W alloy. Furthermore, proportions of Al dissolve in the Mo—W phase during sintering. The sintering process described also incurs the risk of liquid phase being formed at the sintering temperature and a strong, undesirable reaction between Al and Mo—W occurring.

A further possible way of producing sputtering targets via a powder metallurgical route is described in WO 2008 137689 A2. Here, sputtering targets are produced by kinetic spraying or cold gas spraying of powders or powder mixtures composed of at least one of the metals Nb, Ta, W, Mo, Ti, Zr, Cr, V, Mg, Sn, Pb, Al, Zn, Cu, Rh, Ag, Au, Co, Fe, Ru, Re, Ga, In and Sb. The use of sputtering targets produced in this way for the deposition of back contact layers or barrier layers is likewise described. One of the examples described is an MoTi sputtering target which is produced by cold gas spraying and has a two-phase microstructure. Due to the cold gas spraying process, both Mo and Ti remain as elemental phases; no alloying by interdiffusion occurs. However, the binary systems described have the disadvantage that a tailored combination of the required properties can be set to only a limited extent. Thus, simultaneous achievement of high corrosion resistance and oxidation resistance, excellent etching behaviour and also suitability as diffusion barrier is not possible or possible only with great difficulty.

Sputtering targets composed of Mo, Ti or Ni alloys and produced in a similar way are described in WO 2014 073633 A1. Here, parameters for powders or powder mixtures suitable for cold gas spraying are also given.

SUMMARY OF THE INVENTION

It is therefore an object of the present invention to provide a metallization for a thin-film component, which metallization has a very advantageous property combination in respect of the abovementioned requirements. Such a metallization should be inexpensive and have an optimal combination of high corrosion resistance and oxidation resistance, excellent etching behaviour and good suitability as diffusion barrier. A production process for such a layer should also be provided. It is a further object of the present invention to provide a sputtering target for the use described with avoidance of the abovementioned disadvantages. Furthermore, a suitable production process for such a sputtering target, which inexpensively and reproducibly ensures the desired properties of the sputtering target, should be provided.

The object is achieved by the independent claims. Advantageous embodiments are indicated in the dependent claims.

A metallization according to the invention for a thin-film component is characterized in that it comprises at least one layer composed of an Mo-based alloy containing Al and also Ti and usual impurities.

The term usual impurities in the context of a metallization refers to production-related contamination by gases or accompanying elements which can originate from the sputtering targets used for deposition of such a metallization and also from the sputtering atmosphere. However, the contents of metallic accompanying elements correlate in the case of selective sputtering with their contents in the sputtering targets used and are usually less than 1000 µg/g. The contents of C and gases (Ar, O, N) are dependent on the sputtering process (process parameters used, vacuum) and can be up to a number of at %.

Such a metallization has an extremely advantageous combination of corrosion resistance, oxidation resistance and etching behaviour.

The etching behaviour is determined in an industrially used mixture of phosphoric acid, nitric acid and acetic acid (PAN solution) and is particularly favourable in the case of a metallization according to the invention. Targeted setting of the Al content and Ti content enables the corrosion resistance, the oxidation resistance and the etching behaviour of the metallization to be optimized further. The suitability as diffusion barrier can also be controlled by setting of the Al and Ti content.

A metallization according to the invention is resistant to oxidation up to 350° C., in particularly advantageous embodiments even up to 400° C.

For the purposes of the present invention, "oxidation resistance" is the resistance of the surface of the metallization at elevated temperatures under an oxygen-containing atmosphere. The formation of a thin, transparent and protective oxide layer is not disadvantageous or in most cases even desirable as long as there is no associated damage to the surface in the form of nonuniform oxidation, full-area or partial discoloration by oxidation and/or alteration of the optical properties. In such a not disadvantageous case, the surface of the metallization retains its original metallic gloss which can be characterized by an approximately unchanged reflectivity of the surface. For the present purposes, such formation of a thin, transparent and protective oxide layer is not considered to be damage in the sense of a low oxidation resistance. However, when heat treatment of such a metallization at elevated temperatures under an oxygen-containing atmosphere results in nonuniform oxidation, discoloration of the surface (either over the full area or partial) by oxidation and/or a reduction in the reflectivity, this metallization is classified as "not oxidation-resistant".

For the purposes of the present invention "corrosion resistance" is the resistance of the surface of the metallization at high atmospheric humidity. In order to test this, the metallizations to be examined are stored at 85° C. and 85% relative atmospheric humidity in a temperature- and humidity-controlled chamber for 250 hours and 500 hours. Here too, discoloration of the surface (both over the full area and partial) and/or a reduction in the reflectivity are classified as "not corrosion-resistant".

Both an unsatisfactory oxidation resistance and an unsatisfactory corrosion resistance can lead to a restriction of the function of a metallization.

For the purposes of the invention "reflectivity", also referred to as reflectance, is the ratio of reflected to incident light flux. The reflected light flux also includes diffusely reflected or back-scattered light. It is a photometric parameter which characterizes the reflection capability of the layer taking into account the wavelength-dependent sensitivity of the human eye (in daylight, photooptical vision). To measure the reflectance of the metallizations examined, the reflectance R in % at 550 nm was used as a first approximation. At this wavelength, the sensitivity of the human eye (brightness sensitivity, V-lambda curve) is the greatest. The reflectivity of all metallizations examined was measured directly on the surface thereof using a Perkin Elmer Lambda 950 photospectrometer using the W geometry (VW measurement attachment).

Furthermore, the oxidation resistance and the corrosion resistance of the metallizations examined were checked by means of electrical resistance measurement. The measurement is in each case carried out using the 4 point method by means of a commercially available 4 point measuring head from Jandel and a Keithley SourceMeter. Here, a constant current of 10 mA is applied and the decrease in voltage is measured. To achieve very good comparability between different metallizations, the surface resistance, which is independent of the thickness of the metallization, is calculated from the measured decrease in voltage, with an average being calculated from 6 measurement points per sample. An increase in the electrical surface resistance of the metallization indicates damage by oxidation or corrosion. In the case of single-layer metallizations, the specific electrical resistance can also be calculated therefrom taking into account the layer thickness.

Although binary comparative alloys for the at least one layer of an Mo-based alloy composed of Mo and Ti display very good oxidation resistance at and above a Ti content of about 25 at %, they have the great disadvantage that they can be etched or structured only by means of dry etching processes or in exceptional cases in aqueous etching solutions containing hydrofluoric acid. This results in restrictions in the manufacture of thin-film components containing such metallizations, for example in combination with Cu as electrically conductive layer. Cu can be etched or structured only with great difficulty by means of dry etching processes.

Binary comparative alloys for the at least one layer of an Mo-based alloy composed of Mo and Al display comparably good corrosion resistances and oxidation resistances, but also a more advantageous etching behaviour. However, Al has the disadvantage that it reacts with Mo at and above temperatures of about 400° C. to form intermetallic phases having a high electrical resistance. Furthermore, layers of Mo-based alloys composed of Mo and Al have only limited suitability as diffusion barriers against Si.

As a result of combined addition of Al and Ti to the at least one layer composed of an Mo-based alloy with a reduction in the Ti content, the good corrosion resistance and oxidation resistance can be retained and sometimes even improved while the suitability as diffusion barrier is maintained and the metallization according to the invention additionally displays improved etching behaviour in PAN solution. The metallization according to the invention can thus be readily etched or structured in industrially customary wet-chemical etching processes. In addition, the undesirable reaction of Mo and Al can be largely suppressed.

The at least one layer composed of an Mo-based alloy of a metallization according to the invention preferably contains from 10 to 40 at % of Al and from >0 to 15 at % of Ti, with the sum of the contents of Al and Ti not exceeding 50 at %.

At contents of more than 15 at % of Ti, there can be a significant reduction in the etchability in industrially customary wet-chemical etching processes. A preferred Al content of 10 at % and more has a very positive influence on the etching behaviour. A content of more than 40 at % of Al increases the risk of an undesirable reaction with Mo at temperatures of about 400° C.

Further preference is given to the at least one layer composed of an Mo-based alloy of a metallization according to the invention containing from 15 to 30 at % of Al. Contents of Al in the range from 15 to 30 at % ensure a further-optimized etching behaviour in wet-chemical etching processes and excellent corrosion resistance and oxidation resistance of the metallization of the invention.

Further preference is given to the at least one layer composed of an Mo-based alloy of a metallization according to the invention containing from 5 to 10 at % of Ti. It has been found that contents in the range from 5 to 10 at % of Ti give particularly well suited metallizations in respect of a reduction of the reaction of Mo and Al at about 400° C. Furthermore, the good suitability as diffusion barrier is retained and very good etching behaviour (good etchability) is present.

Even greater preference is given to a combination of from 15 to 30 at % of Al and from 5 to 10 at % of Ti in the at least one layer composed of an Mo-based alloy of a metallization according to the invention. This combination leads to a further optimization of the metallization of the invention for a thin-film component both from the point of view of manufacture (high oxidation resistance, etching behaviour) and from a use point of view (high corrosion resistance, low electrical resistance).

The sum of the contents of Al and Ti in the at least one layer composed of an Mo-based alloy of a metallization according to the invention is very particularly preferably greater than or equal to 30 at %. The sum of the contents of Al and Ti in this case also does not exceed 50 at %. Contents of Al and Ti in this range lead to the oxidation resistance of this layer being maintained at temperatures up to 400° C.

In a preferred embodiment, the at least one layer composed of an Mo-based alloy of a metallization according to the invention consists of a total of up to 50 at % of Al and Ti, balance Mo and usual impurities. Further preference is given to the at least one layer composed of an Mo-based alloy of a metallization according to the invention consisting of from 10 to 40 at % of Al and from >0 to 15 at % of Ti, balance Mo and usual impurities. Even greater preference is given to the at least one layer composed of an Mo-based alloy of a metallization according to the invention consisting of from 15 to 30 at % of Al and from 5 to 10 at % of Ti, balance Mo and usual impurities.

The thickness of the at least one layer composed of an Mo-based alloy of a metallization according to the invention is preferably not more than 1 μm, more preferably not more than 0.5 μm. These thicknesses are particularly well suited for use of such layers in corresponding thin-film components. A metallization according to the invention can also have one or more further layers composed of one or more other materials in addition to the at least one layer composed of an Mo-based alloy.

FIG. 2 shows, by way of example, the structure of thin-film components comprising at least one metallization 2 according to the invention in cross section. The metallization 2 serves, for example, as conductor track or is, as electrode, part of a thin-film transistor (TFT). Furthermore, the thin-film components shown comprise a substrate 1, for example of glass, plastic or silicon. Such a substrate can have been previously coated in its entirety or only partly with one or more layers composed of other materials. Furthermore, the depicted metallizations for thin-film components contain at least one layer of an Mo-based alloy 3. In addition, at least one covering layer (3, 6) and/or an intermediate layer/diffusion barrier (3, 5) and also at least one metallic layer 4 composed of Al, Cu, Ag or Au or an alloy based on these metals can be provided.

In a preferred variant, the metallization is made up of a plurality of layers, in particular two layers or three layers. In these preferred embodiments of a metallization according to the invention, at least one metallic layer composed of Al, Cu, Ag or Au or an alloy based on (where "based on" means that the constituent of the main component of the alloy is present in an amount of more than 50 at %) one of these metals in addition to the at least one layer composed an Mo-based alloy, as a result of which an even higher electrical conductivity of the metallization can be achieved.

The at least one layer composed of an Mo-based alloy can have been applied to the side of the metallic layer composed of Al, Cu, Ag or Au or an alloy based on these metals facing away from the substrate and serve as covering layer in order to ensure corrosion resistance and oxidation resistance of the metallization. Examples of such a metallization are shown in FIGS. 2b, 2d and 2e.

As an alternative, the at least one layer composed of an Mo-based alloy can have been applied to the side of the metallic layer composed of Al, Cu, Ag or Au or an alloy based on these metals facing the substrate and serve as intermediate layer, for example in order to prevent or limit diffusion between the substrate and the metallic layer composed of Al, Cu, Ag or Au or an alloy based on these metals (diffusion barrier). Examples of such a metallization are shown in FIGS. 2c, 2d and 2f.

A further preferred embodiment of the metallization of the invention provides both a covering layer and also an intermediate layer/diffusion barrier, which can in each case be made of an Mo-based alloy as described above (FIGS. 2d, 2e and 2f). Here, the same type 3 or a different type of covering layer 6 or intermediate layer/diffusion barrier 5 can be provided in each case.

Depending on the materials used for the metallization, for example for a metallic layer 4 present therein, and the areal extension of the electronic appliance containing the corresponding thin-film components, a structure as shown in FIGS. 2a to 2d is preferably used. Further preference is given to a structure as shown in FIG. 2d.

A metallization according to the invention for a thin-film component is optimally suited to use in many electronic appliances, for example in LCDs (liquid crystal displays) or OLED (organic light-emitting diode) displays, in PC (personal computer) systems or in mobile appliances such as mobile telephones, smartphones, tablet PCs, PDAs (personal digital assistants), portable music players, solar cells, etc. A metallization according to the invention for a thin-film component is preferably used as conductor track or electrode.

A metallization according to the invention is preferably used for a thin-film component in LCDs (liquid crystal displays) or OLED (organic light-emitting diode) displays.

A metallization according to the invention is preferably produced by deposition of one or more layers of the metallization by means of known thin-film coating technologies such as PVD (physical vapour deposition).

A process according to the invention for producing a metallization for a thin-film component comprises at least the following steps:

provision of at least one sputtering target deposition of at least one layer of an Mo-based alloy containing Al and Ti and usual impurities structuring of the metallization by means of at least one photolithographic process and at least one subsequent etching step At least one layer of an Mo-based alloy containing Al and Ti is applied by means of a PVD process, preferably a magnetron sputtering process, from the at least one sputtering target to at least 50% of the surface of a suitable substrate.

The at least one sputtering target can, for example, be a metallic sputtering target according to the invention which is composed of an Mo-based alloy containing Al and Ti and usual impurities and is described below. However, it is also possible to use other sputtering targets, for example a plurality of sputtering targets composed of pure metals, in a process according to the invention for producing a metallization for thin-film components.

Suitable substrates are, for example, glass or polymer films. Such a substrate can have previously been coated in its entirety or only partly with one or more layers of other materials.

The metallization according to the invention is structured and processed further by means of at least one photolithographic process and at least one subsequent etching step. The at least one etching step is preferably carried out using an industrially employed mixture of phosphoric acid, nitric acid and acetic acid (PAN solution), but it is also possible to use other etching solutions. Such photolithographic processes with a subsequent etching step are usually repeated in order to structure a metallization according to the invention and optionally also further layers present.

A process according to the invention for producing a metallization for a thin-film component can further comprise one or more of the following steps:
- application of one or more organic layers
- application of one or more TCO (transparent conductive oxide) layers
- application of one or more layers selected from the group (insulation layer, planarization layer, buffer layer)
- laser treatment
- lamination with a protective film or a protective glass
- assembling As stated above, a sputtering target according to the invention composed of an Mo-based alloy containing Al and Ti and usual impurities can be used in a process according to the invention for producing a metallization for a thin-film component.

A sputtering target according to the invention consists of an Mo-based alloy and is characterized in that it contains Al and Ti and usual impurities.

The expression usual impurities refers to production-related contamination by gases or accompanying elements which originate from the raw materials used. The proportion of such impurities in a sputtering target according to the invention is preferably in total below 2000 μg/g (corresponding to ppm) for C and gases (H, N, O) and in total below 500 μg/g for other elements. Suitable methods for chemical elemental analysis are known to depend on the element. The chemical analysis of a sputtering target according to the invention was carried out using ICP-OES (optical emission spectrometry with inductively coupled plasma), XRF (X-ray fluorescence analysis) and GDMS (glow discharge mass spectrometry).

A sputtering target according to the invention preferably has a proportion of impurities in the range below 1000 μg/g for C and gases (H, N, O) and below 200 μg/g for other elements.

For the purposes of the present invention, the expression Mo-based alloy refers to alloys containing at least 50 at % of Mo.

A sputtering target according to the invention composed of an Mo-based alloy preferably contains from 10 to 40 at % of Al and from >0 to 15 at % of Ti, with the sum of the contents of Al and Ti not exceeding 50 at %.

Such a sputtering target enables an above-described metallization according to the invention containing at least one layer of appropriate Mo-based alloys to be deposited in an optimal manner. The use of a sputtering target according to the invention is preferred to cosputtering of a plurality of targets since it enables better layer homogeneity on large-area substrates to be ensured. In addition, these contents of Al and Ti are also advantageous in a sputtering target since they greatly increase the corrosion resistance of the target. As a result, the handling of such a sputtering target is made easier and its life in a sputtering unit where it is in contact with a cooling medium (e.g. water) is increased.

Furthermore, a sputtering target according to the invention is preferably characterized in that it does not contain any proportions of intermetallic phases which can be detected by means of X-ray diffraction (XRD).

For the present purposes, the term intermetallic phases refers to, for example, all possible intermetallic phases in the phase diagram Al—Mo (FIG. 1), with other binary or ternary phases in, for example, the three-component system Mo—Al—Ti likewise being included. The occurrence of detectable proportions of intermetallic phases can be established in a simple way by recording of an X-ray diffraction pattern, in this case by means of a D4 Endeavor diffractometer from Bruker using CuKα radiation in the Bragg-Brentano geometry. The usual detection limit in this method is a phase content of about 3% by volume.

Intermetallic phases in the microstructure of a sputtering target according to the invention are undesirable because, inter alia, the workability is restricted by the usually high hardness and low toughness of such phases. In addition, intermetallic phases can have an adverse effect on the sputtering behaviour and be, for example, a source of particles or arcing. This also reduces the quality of the deposited layer.

A sputtering target according to the invention more preferably contains from 15 to 30 at % of Al.

A sputtering target according to the invention more preferably contains from 5 to 10 at % of Ti.

Contents of Ti in this range have the additional advantage that production of the target by cold gas spraying is made even easier. Ti is easy to process in powder form and is obtainable in very good and pure quality.

A sputtering target according to the invention even more preferably contains a combination of from 15 to 30 at % of Al and from 5 to 10 at % of Ti.

A sputtering target according to the invention even more preferably contains a total proportion of Al and Ti of greater than or equal to 30 at %. The sum of the contents of Al and Ti also does not exceed 50 at %.

In a preferred embodiment, a sputtering target according to the invention consists of a total of up to 50 at % of Al and Ti, balance Mo and usual impurities. Further preference is given to a sputtering target according to the invention consisting of from 10 to 40 at % of Al and from >0 to 15 at % of Ti, balance Mo and usual impurities. Even greater preference is given to a sputtering target according to the invention consisting of from 15 to 30 at % of Al and from 5 to 10 at % of Ti, balance Mo and usual impurities.

A sputtering target according to the invention also preferably has a hardness below 400 HV10.

When the sputtering target has a hardness below 400 HV10 (Vickers hardness in accordance with DIN EN ISO 6507-1), mechanical workability can be optimally ensured.

A sputtering target according to the invention preferably has a relative density of more than 95%. A relative density of more than 97% is particularly advantageous. The relative density can, as is known, be determined in a simple manner according to the Archimedes principle by means of buoyancy methods.

The higher the relative density of the sputtering target, the more advantageous are its properties in respect of the sputtering behaviour. Sputtering targets having a low relative density have a relatively high proportion of pores which can be a source of impurities and particles in the layer. Furthermore, the sputtering rate of material having a comparatively low density is lower than of material having a high density.

Installation of a sputtering target according to the invention in various coating plants and also use for coating substrates of various geometries imposes various geometric requirements on a sputtering target according to the invention. Thus, such a target can be in the form of a flat target, for example as a plate or disc, as rod, as tubular target or as other bodies having a complex shape.

Sputtering targets according to the invention composed of an Mo-based alloy can be produced by means of a process according to the invention. Such a process according to the invention for producing a sputtering target composed of an Mo-based alloy comprises at least the following steps:

provision of a powder mixture containing Mo and also Al and Ti cold gas spraying (CGS) of the powder mixture onto a suitable support material.

The powder mixture provided can contain either pure powders or previously prealloyed powders. Powders used can be conveyed either separately or together. The powder mixture can thus be prepared before or else only in the plant used for the cold gas spraying, for example in an appropriate nozzle. The process of cold gas spraying can be controlled particularly well by separate conveying of individual powders of the powder mixture.

The input of thermal energy during production of the sputtering target has to be so low that no intermetallic phases can be formed. In alternative production processes such as hot pressing or hot isostatic pressing, the formation of intermetallic phases cannot be prevented, or be prevented only incompletely, because of the high process temperatures and hold times. A blank produced by such processes therefore usually has an excessively high hardness and low toughness and can be worked mechanically only with difficulty. Furthermore, intermetallic phases in the microstructure of a sputtering target can lead to a disadvantageous sputtering behaviour of the target.

Suitable support materials which are used in a process according to the invention can, for example, be plate-like or tubular and can be made of steel, Ti, Cu, Al or an alloy based on one of these metals.

A process according to the invention preferably further comprises the following step:

application of a metallic bonding layer

To improve the adhesion of the powder mixture applied by means of cold gas spraying to the support material, a metallic bonding layer, for example Al, can additionally be applied to the support material. Such a bonding layer is particularly advantageous for support materials having a relatively high hardness (Ti, steel). This bonding layer can, for example, likewise be applied by cold gas spraying, but other possibilities (e.g. other spraying processes, slurry coating, cladding, PVD processes, CVD (chemical vapour deposition) processes) are also conceivable.

A process according to the invention for producing a sputtering target can further comprise one or more of the following steps in an order matched to the respective requirements:

mechanical working
heat treatment step
forming step
soldering (bonding) onto one or more support elements Corresponding mechanical working can, for example, comprise one or more turning, milling or grinding processes in which the desired dimensions of the sputtering target and/or the surface roughness thereof can be set.

In a corresponding heat treatment step, it is possible, for example, for residual stresses in the sputtering target to be dissipated. Furthermore, inducement of diffusion processes which lead to further-improved adhesion to the support material is also conceivable.

A corresponding forming step can be effected, for example, in the case of flat sputtering targets (flat targets) by rolling or in the case of tubular sputtering targets by extrusion. Such a forming step can lead to a further increase in the density and also to a further-optimized microstructure and consequently to further-improved properties of the sputtering target.

A sputtering target according to the invention can be soldered onto one or more support elements (bonding). For this purpose, appropriate support elements in the form of plates or tubes or tube segments can be used. Solder material having a low melting point, for example In or an In alloy, is preferably used for this purpose.

DESCRIPTION OF THE INVENTION

Examples

Example 1

In the present example, a thin-film component as shown in FIG. 2a was constructed.

In the series of experiments, various metallizations each containing a layer of an Mo-based alloy having a different chemical composition were produced. The layers were deposited from sputtering targets composed of pure molybdenum, pure aluminium, pure titanium and Mo-based alloys containing 10 at % of Ti and 20 at % of Ti. The layers composed of Mo-based alloys containing Al and Ti were produced by cosputtering of 2 or 3 different sputtering targets. Here, the chemical composition of the layer was varied via the combination of different sputtering targets and the sputtering power applied to the sputtering targets. The chemical composition of the layers produced is shown in Table 1.

To determine the suitability of the layers composed of Mo-based alloys as covering layer, glass substrates (Corning Eagle XG®, 50×50×0.7 mm$^3$) were coated with the layers composed of Mo-based alloys and their corrosion resistance and oxidation resistance were subsequently tested. In the test for oxidation resistance, the layers were heated at 330° C. in air for 1 hour. To test the corrosion resistance, the specimens were stored in a temperature- and humidity-controlled chamber at 85° C. and 85% relative atmospheric humidity for 250 hours and 500 hours. Pure Mo, MoTi10 and MoTi20 served as reference materials.

FIG. 3 shows the various layers after the test for oxidation resistance. The reference materials and the layer composed of the Mo-based alloy containing 8 at % of Al and 8 at % of Ti display a highly discoloured surface and thus low oxidation resistance.

FIG. 4 shows the various layers after the test for corrosion resistance. After 250 hours in the temperature- and humidity-controlled chamber, both the reference materials and the layer composed of the Mo-based alloy containing 8 at % of Al and 8 at % of Ti and also the layer composed of the Mo-based alloy containing 9 at % of Al and 16 at % of Ti display corrosion damage. The result of the 500 hour temperature- and humidity-controlled chamber test (see FIG. 5) is comparable to the result of the 250 hour test.

The reflectivity of all layers was measured directly on the surface of the layers using a Perkin Elmer Lambda 950 photospectrometer using the W geometry (VW measurement attachment) at wavelengths from 250 to 850 nm. The results are likewise summarized in Table 1. The greater the difference between the measured value and the starting state ("as coated"), the greater is the damage to the surface. Even a difference of more than 3% can be perceived by the human eye. As limit for possible use, a reduction in the reflectivity relative to the starting state of 5% was set down in this experiment.

TABLE 1

| Composition of the layer (at. %) | Reflectivity at 550 nm (%) | | | |
|---|---|---|---|---|
| | As coated | 330° C., 1 h, air | 250 h, 85° C., 85% relative hum. | 500 h, 85° C., 85% relative hum. |
| Mo | 59.6 | 41.8 | 34.1 | 5.5 |
| MoTi 10 | 57.4 | 28.3 | 14.0 | 16.4 |
| MoTi 20 | 56.6 | 38.3 | 40.2 | 29.7 |
| MoAlTi 8-8 | 57.1 | 36.4 | 27.9 | 12.9 |
| MoAlTi 16-8* | 56.4 | 53.1 | 57.2 | 55.5 |
| MoAlTi 24-6* | 55.8 | 53.8 | 56.5 | 55.9 |
| MoAlTi 9-16 | 56.7 | 51.4 | 54.1 | 51.0 |
| MoAlTi 16-15* | 56.2 | 52.9 | 56.9 | 56.0 |
| MoAlTi 24-14* | 55.3 | 53.3 | 56.3 | 55.2 |

*indicates particularly advantageous embodiments according to the invention

The specific electrical resistance of the layers and of the reference materials was measured in the starting state, after the test for oxidation resistance and after the test for corrosion resistance. The structure as shown in FIG. 2a was selected in order to be able to ensure a very precise measurement of the specific electrical resistance. The deposited layer thickness was in each case 300 nm. The measurement was carried out using the 4 point method using a commercially available 4 point measuring head from Jandel and a Keithley SourceMeter. Here, a constant current of 10 mA was applied and the decrease in voltage was measured. The specific electrical resistance over the layer thickness was calculated therefrom. 6 measurement points per specimen were averaged. The results are summarized in Table 2. The test for oxidation resistance did not significantly influence the conductivity (the specific electrical resistance) of the layers examined. The highly corroded specimens (test for corrosion resistance), however, had inhomogeneous measurement values through to insulating places on the surface (no measurement possible). The specimens having the high contents of Al and Ti display a corrosion resistance and oxidation resistance which is significantly improved compared to the reference materials.

TABLE 2

| Composition of the layer (at. %) | Specific electrical resistance [μ Ohm cm] | | | |
|---|---|---|---|---|
| | As coated | 330° C., 1 h, air | 250 h, 85° C., 85% relative hum. | 500 h, 85° C., 85% relative hum. |
| Mo | 12 | 13 | inhomogeneous | inhomogeneous |
| MoTi 10 | 28 | 28 | inhomogeneous | inhomogeneous |
| MoTi 20 | 36 | 41 | inhomogeneous | inhomogeneous |
| MoAlTi 8-8 | 100 | 103 | 109 | inhomogeneous |
| MoAlTi 16-8* | 121 | 122 | 145 | 147 |
| MoAlTi 24-6* | 149 | 152 | 152 | 148 |
| MoAlTi 9-16 | 93 | 96 | 85 | 85 |
| MoAlTi 16-15* | 124 | 126 | 113 | 111 |
| MoAlTi 24-14* | 152 | 155 | 148 | 148 |

*indicates particularly advantageous embodiments according to the invention

To examine the etching behaviour, the layers having a thickness of in each case 300 nm were etched in a stirred PAN solution containing 66% by weight of phosphoric acid, 10% by weight of acetic acid, 5% by weight of nitric acid and water (balance) at 40° C. The phosphoric acid used consists of an 85% strength aqueous solution, the nitric acid of a 65% strength aqueous solution and the acetic acid is pure (100%). To determine the etching rate, the specimens were each dipped for 5 seconds into the etching solution and subsequently rinsed with deionized water and dried. The dry specimens were subsequently weighed on a precision balance. The steps were repeated until the entire layer had been dissolved. The etching rate (wet etching rate) was calculated from the decrease in mass over the etching time. The results are summarized in Table 3. All layers examined can be etched in PAN solution, with the etching rate decreasing greatly with increasing Ti content.

TABLE 3

| Composition of the layer (at. %) | Wet etching rate (nm/min) |
|---|---|
| Mo | 1550 |
| MoTi 10 | 1443 |
| MoTi 20 | 208 |
| MoAlTi 8-8 | 1154 |
| MoAlTi 16-8* | 842 |
| MoAlTi 24-6* | 611 |
| MoAlTi 9-16 | 180 |
| MoAlTi 16-15* | 165 |
| MoAlTi 24-14* | 140 |

*indicates particularly advantageous embodiments according to the invention

Example 2

In the series of experiments, metallizations containing layers composed of Mo-based alloys containing 20 at % of Al and 5 at % of Ti (MoAlTi 20-5), 25 at % of Al and 5 at % of Ti (MoAlTi 25-5) and 25 at % of Al and 10 at % of Ti (MoAlTi 25-10) were produced. The layers were deposited from sputtering targets having the corresponding chemical compositions. To determine the suitability of the layers composed of the Mo-based alloys as diffusion barrier against Si, Si wafers (diameter 3 inches, thickness 380 μm) were coated with the corresponding layers composed of the Mo-based alloys (layer 3, see FIG. 2c) and in each case Cu layers (metallic layer 4, see FIG. 2c). The structure as shown in FIG. 2c was selected since additional layers can block the view onto the Cu layers. The layer thickness was 50 nm for the layers composed of the Mo-based alloys and 200 nm for the Cu layers.

To test the suitability of the layers composed of the Mo-based alloys as diffusion barrier, the metallizations were heat treated at various temperatures under reduced pressure ($10^{-5}$ mbar) for 30 minutes. Pure Mo and an Mo alloy containing 50 at % of Al served as reference materials.

The suitability of the layer as diffusion barrier is no longer ensured when the surface of the Cu layer displays silvery discoloration and the electrical surface resistance increases significantly. This is an indication that intermetallic phases composed of Cu and Si have been formed. The electrical surface resistance was calculated/measured after coating (starting state) and after the heat treatments. The measurement was carried out using the 4 point method (commercially available 4 point measuring head). The results are summarized in FIG. 6.

The layer composed of the Mo-based alloy containing 20 at % of Al and 5 at % of Ti loses its suitability as diffusion barrier against silicon at about 650° C. This is an only insignificantly lower temperature than in the case of the reference specimen with Mo layer (700° C.). At a higher Al content in the layer, for example in the case of the Mo alloy containing 50 at % of Al, the suitability as diffusion barrier is lost at as low as 300° C. (FIG. 6). Increasing the Ti content in the layers composed of Mo-based alloys enables the suitability as diffusion barrier to be improved further at relatively high Al contents in the alloy (comparison of MoAlTi 25-5 and MoAlTi 25-10 in FIG. 6). These layers thus satisfy the suitability as diffusion barrier required for use together with the above-described advantages of an increased corrosion resistance and oxidation resistance in an optimal manner (see Example 1).

Example 3

Commercial Mo, Al and Ti powders suitable for cold gas spraying were sprayed by means of cold gas spraying onto an Al tube as support material. The powders were conveyed from separate containers. The chemical composition was set via the transport rates of the individual powders. The microstructure of the resulting sputtering target containing 20 at % of Al and 5 at % of Ti is shown in cross section (scanning electron micrograph) in FIG. 7. The microstructure is typical of a material produced by cold gas spraying, having longitudinal grains whose longer axis is arranged parallel to the surface of the support material. As a result of the cold gas spraying, no intermetallic phases are formed in the production of the sputtering target, as the X-ray diffraction pattern in FIG. 8 shows. This was recorded by means of a D4 Endeavor diffractometer from Bruker using CuKα radiation in the Bragg-Brentano geometry.

Example 4

A thin-film component as shown in FIG. 2a was constructed in this example.

In the series of experiments, various metallizations each containing a layer composed of an Mo-based alloy having a different chemical composition were produced. The layers composed of Mo-based alloys containing Al and Ti were deposited from sputtering targets having the corresponding chemical compositions. Layers composed of Mo-based alloys containing 20 at % of Al and 5 at % of Ti (MoAlTi 20-5), 20 at % of Al and 10 at % of Ti (MoAlTi 20-10), 25 at % of Al and 5 at % of Ti (MoAlTi 25-5) and 25 at % of Al and 10 at % of Ti (MoAlTi 25-10) were deposited.

To determine the suitability of the layers composed of Mo-based alloys as covering layer, glass substrates (Corning Eagle XG®, 50×50×0.7 mm$^3$) were coated with the layers composed of Mo-based alloys and the oxidation resistance thereof was subsequently tested. For the test for oxidation resistance, the layers were heated at 400° C. in air for 1 hour.

FIG. 9 shows the various layers after the test. The layers composed of Mo-based alloys having a total proportion of Al and Ti of greater than or equal to 30 at % display no discoloration of the surface and are thus oxidation-resistant up to 400° C.

Figure 1:
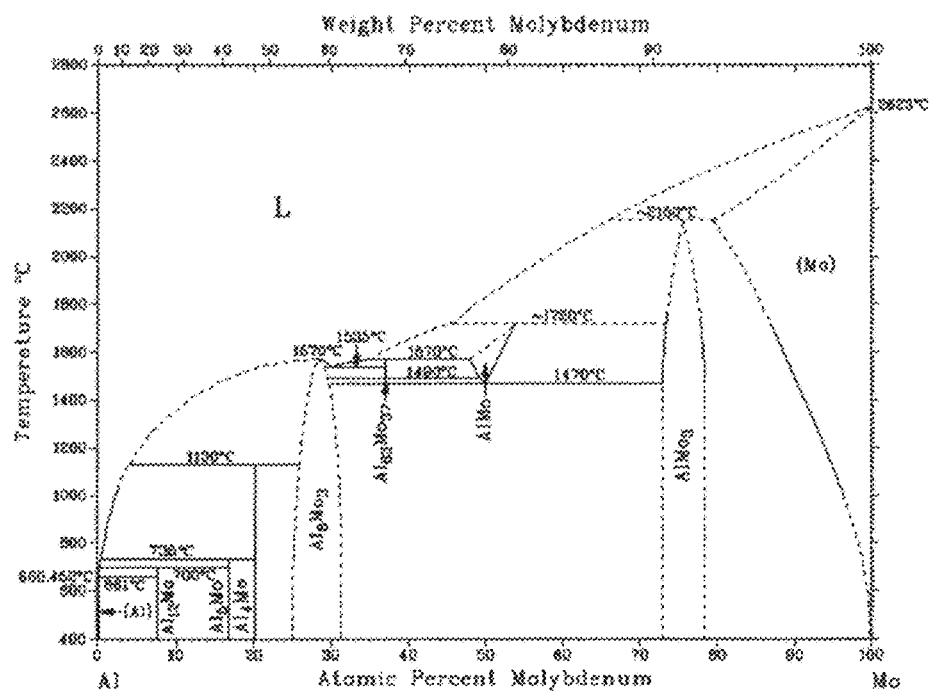
FIG. 1: phase diagram of the system Al—Mo (source: ASM International's Binary Alloy Phase Diagrams, Second Edition).
Figure 2:
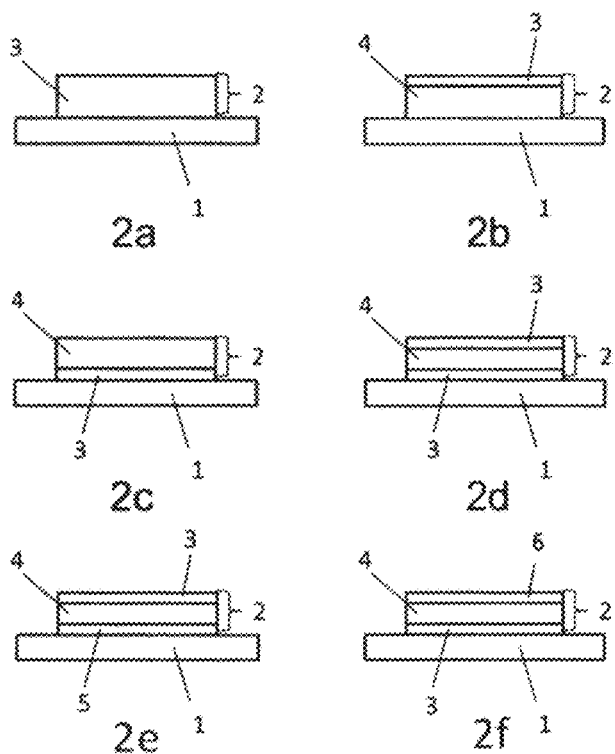
FIG. 2: possible structure of thin-film components comprising at least one metallization according to the invention in cross section.
1: substrate; 2: metallization; 3: layer of an Mo-based alloy; 4: layer of Al, Cu, Ag or Au or an alloy based on these metals; 5: other intermediate layer/diffusion barrier; 6: other covering layer.
Figure 3:
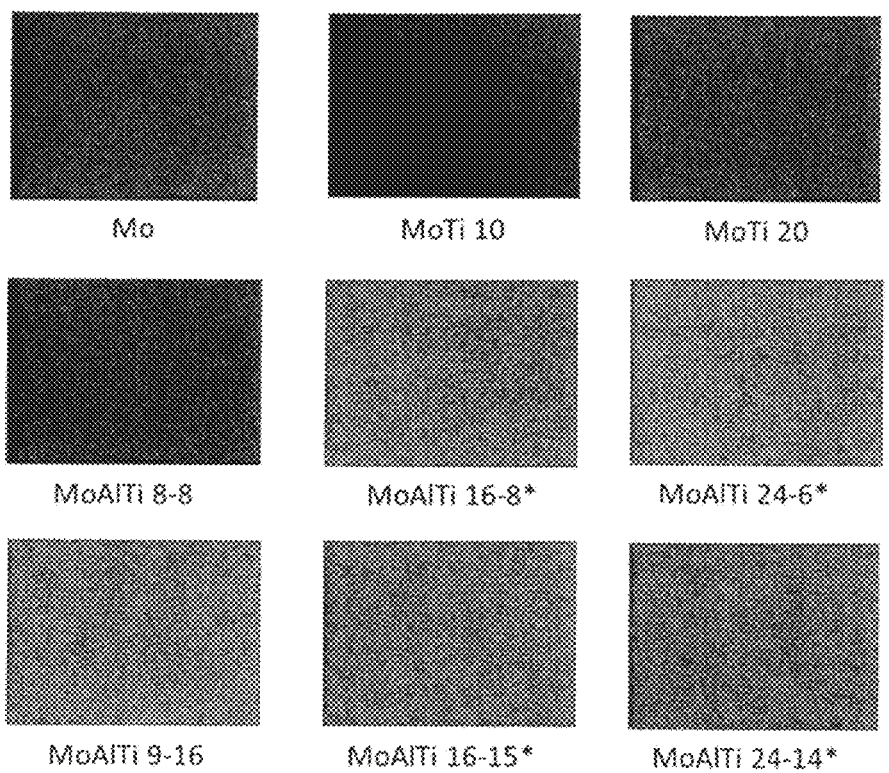
FIG. 3: surface photograph of the layers examined after the test for oxidation resistance (heating at 330° C. in air for 1 hour). * indicates particularly advantageous embodiments according to the invention.
Figure 4:
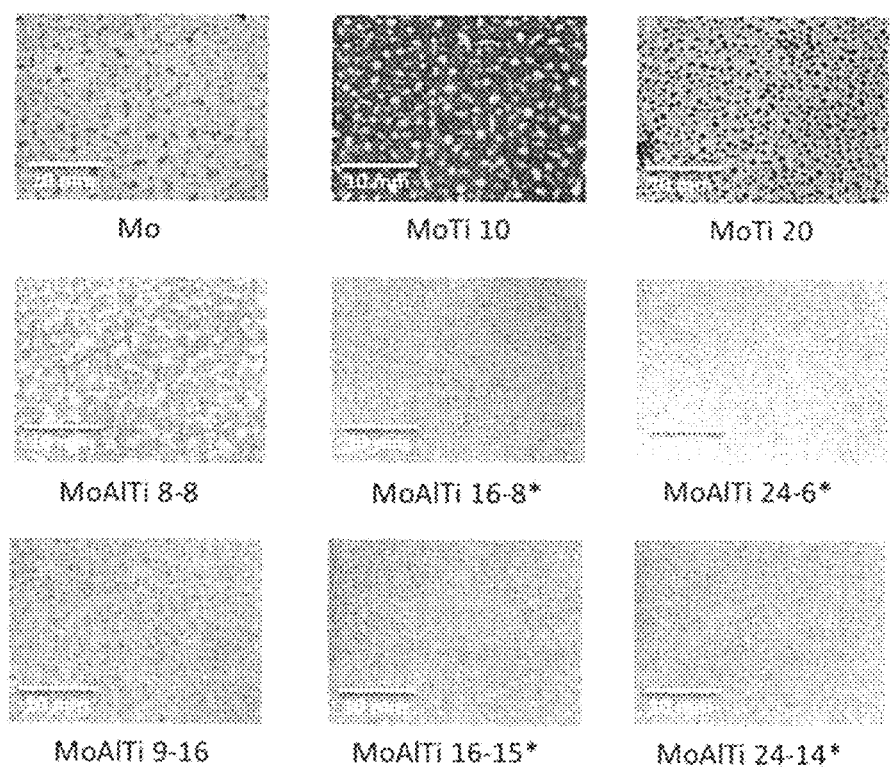
FIG. 4: surface photographs of the layers examined after the test for corrosion resistance (250 hours in the temperature- and humidity-controlled chamber at 85° C. and 85% relative atmospheric humidity). * indicates particularly advantageous embodiments according to the invention.
Figure 5:
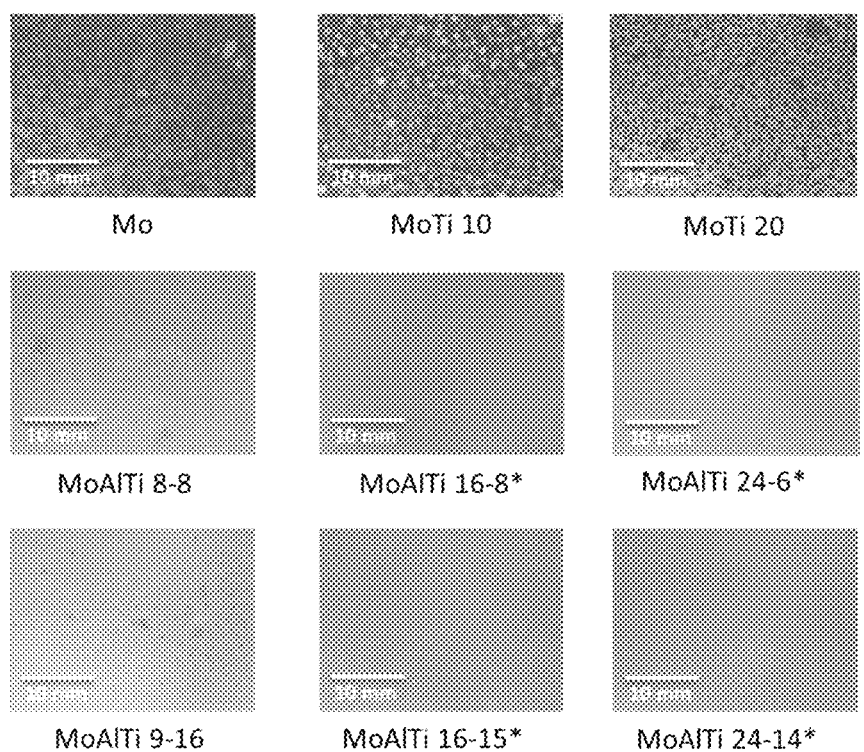
FIG. 5: surface photographs of the layers examined after the test for corrosion resistance (500 hours in the temperature- and humidity-controlled chamber at 85° C. and 85% relative atmospheric humidity). * indicates particularly advantageous embodiments according to the invention.
Figure 6:
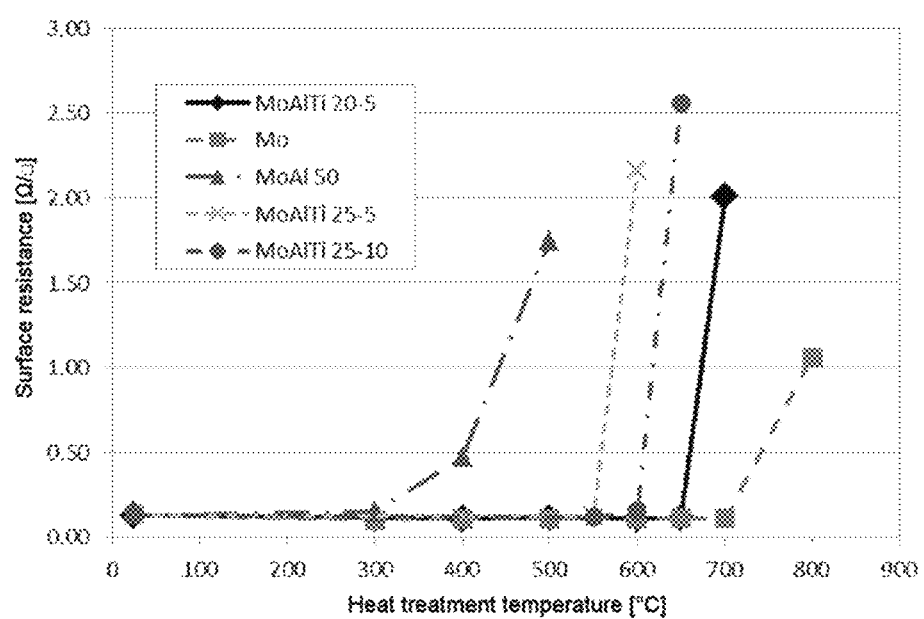
FIG. 6: surface resistance of the heat-treated specimens (50 nm layer of Mo or Mo-based alloy and 200 nm Cu layer on silicon substrate) vs. heat treatment temperature.
Figure 7:
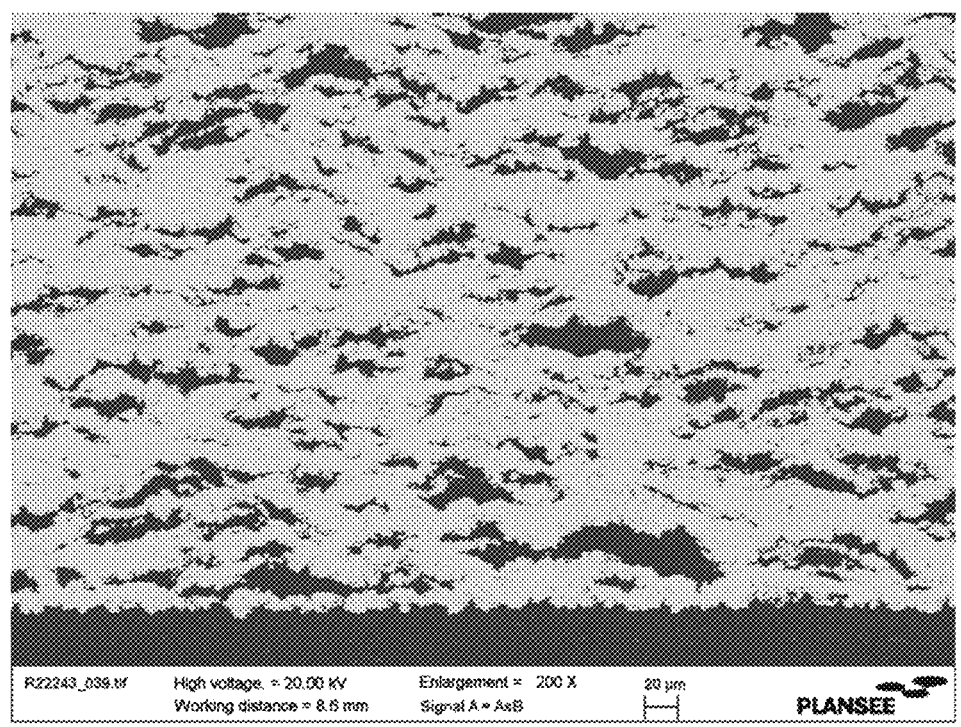
FIG. 7: scanning electron micrograph of a sputtering target containing 20 at % of Al and 5 at % of Ti. Dark regions at lower margin of the image: support material composed of Al. Dark regions in the microstructure: Al and Ti. Light-coloured regions: Mo.
Figure 8:
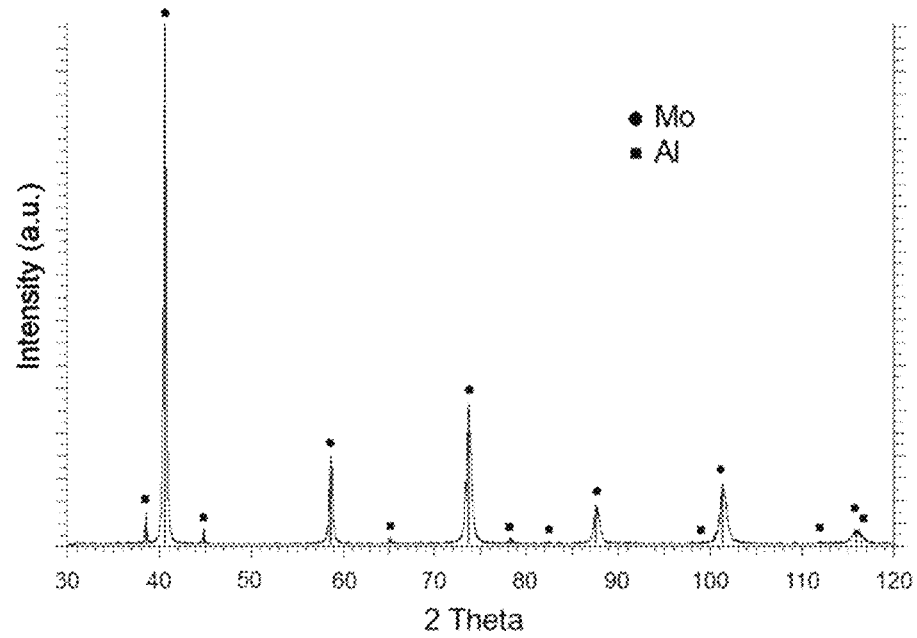
FIG. 8: X-ray diffraction pattern of a sputtering target containing 20 at % of Al and 5 at % of Ti. No intermetallic phases can be detected.
Figure 9:
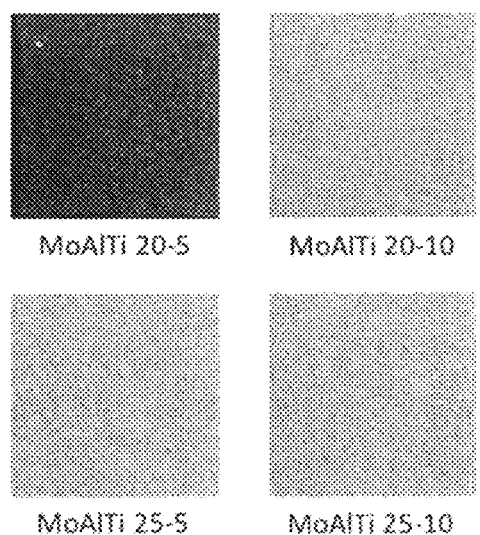
FIG. 9: surface photographs of the layers examined after the test for oxidation resistance (heating at 400° C. in air for 1 hour).

The invention claimed is:

1. A sputtering target suitable for deposition of metallizations for thin-film components, comprising:
    an Mo-based alloy, the Mo-based alloy consisting of Mo, Al, Ti and usual impurities; with:
        Al having a content of from 10 to 40 at %;
        Ti having a content of from 5 to 15 at %;
        a sum of said contents of Al and Ti not exceeding 50 at %; and
        a balance of Mo;
    said Mo-based alloy forming the sputtering target suitable for deposition of metallizations for thin-film components, and the sputtering target not containing any proportions of intermetallic phases being detectable by X-ray diffraction (XRD).

2. The sputtering target according to claim 1, wherein the content of said Al is from 15 to 30 at %.

3. The sputtering target according to claim 1, wherein the content of said Ti is from 5 to 10 at %.

4. The sputtering target according to claim 1, wherein the sputtering target has a hardness below 400 HV10.

* * * * *

UNITED STATES PATENT AND TRADEMARK OFFICE
CERTIFICATE OF CORRECTION

PATENT NO. : 11,047,038 B2
APPLICATION NO. : 15/504997
DATED : June 29, 2021
INVENTOR(S) : Harald Koestenbauer et al.

Page 1 of 1

It is certified that error appears in the above-identified patent and that said Letters Patent is hereby corrected as shown below:

In the Specification

Background of the Invention:

Column 2, Lines 44-55 should read the following:
Sputtering targets composed of Al alloys which can be
used for producing diffusion barriers in displays (diffusion between Si
and Al) are described, for example, in JP 2011232654 A. The
corresponding use in Al alloy layer containing a monolayer of an Al-Mo
alloy containing ≤ 30 at% of Mo or an Al-Mo-X alloy containing Mo
and at least one of the elements X, where X=(Mn, Nd, Ni, Mg and Fe) is
also known. However, excessively high Al contents in such alloy layers
can lead to the layers no longer being suitable as diffusion barriers since
Al is not suitable as diffusion barrier against Si. In addition, undesirable
reactions between Al and Mo can occur.

Signed and Sealed this
Fourteenth Day of September, 2021

Drew Hirshfeld
*Performing the Functions and Duties of the*
*Under Secretary of Commerce for Intellectual Property and*
*Director of the United States Patent and Trademark Office*